(12) United States Patent
Root

(10) Patent No.: US 6,586,954 B2
(45) Date of Patent: Jul. 1, 2003

(54) PROBE TILE FOR PROBING SEMICONDUCTOR WAFER

(75) Inventor: Bryan J. Root, Apple Valley, MN (US)

(73) Assignee: Celadon Systems, Inc., Apple Valley, MN (US)

( * ) Notice: Subject to any disclaimer, the term of this patent is extended or adjusted under 35 U.S.C. 154(b) by 0 days.

(21) Appl. No.: 09/730,130

(22) Filed: Dec. 4, 2000

(65) Prior Publication Data

US 2002/0084794 A1 Jul. 4, 2002

Related U.S. Application Data

(63) Continuation-in-part of application No. 09/021,631, filed on Feb. 10, 1998, now Pat. No. 6,201,402.

(51) Int. Cl.[7] ............................................. G01R 31/02
(52) U.S. Cl. ........................ 324/754; 324/761; 324/762
(58) Field of Search ............................... 324/754, 761, 324/762, 765; 439/482, 67, 71

(56) References Cited

U.S. PATENT DOCUMENTS

| | | | |
|---|---|---|---|
| 3,787,768 A | | 1/1974 | Kubota et al. |
| 4,667,523 A | | 5/1987 | Becker et al. |
| 5,003,254 A | | 3/1991 | Hunt et al. |
| 5,015,947 A | * | 5/1991 | Chism ........................ 324/72.5 |
| 5,150,040 A | | 9/1992 | Byrnes et al. |
| 5,151,653 A | * | 9/1992 | Yutori et al. ................ 324/72.5 |
| 5,168,218 A | | 12/1992 | Rich |
| 5,192,907 A | | 3/1993 | Bonaria |
| 5,325,052 A | | 6/1994 | Yamashita |
| 5,473,254 A | | 12/1995 | Asar |
| 5,488,292 A | | 1/1996 | Tsuta |
| 5,742,174 A | * | 4/1998 | Kister et al. ................. 324/754 |
| 5,952,843 A | * | 9/1999 | Vinh ........................... 324/761 |
| 6,050,829 A | * | 4/2000 | Eldridge et al. ............. 439/761 |
| 6,275,051 B1 | * | 8/2001 | Bachelder et al. ........... 324/765 |

* cited by examiner

Primary Examiner—Vinh P. Nguyen
(74) Attorney, Agent, or Firm—Dorsey & Whitney LLP

(57) ABSTRACT

A tile used to hold one or more probes for testing a semiconductor wafer. The tile has one or more sites for inserting one or more probes to test the semiconductor wafer. Each site has one or more holes. Each hole is coupled with a slot forming an angle. A probe is inserted into the tile from a top of the tile through the hole and seated on the slot. The probe has a probe tip. The probe tip is in contact with the semiconductor wafer at one end of the slot at a bottom of the tile. The probe tip is aligned with X and Y coordinates of a bond pad on the semiconductor wafer.

16 Claims, 19 Drawing Sheets

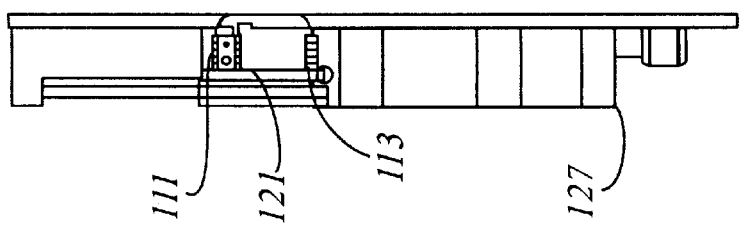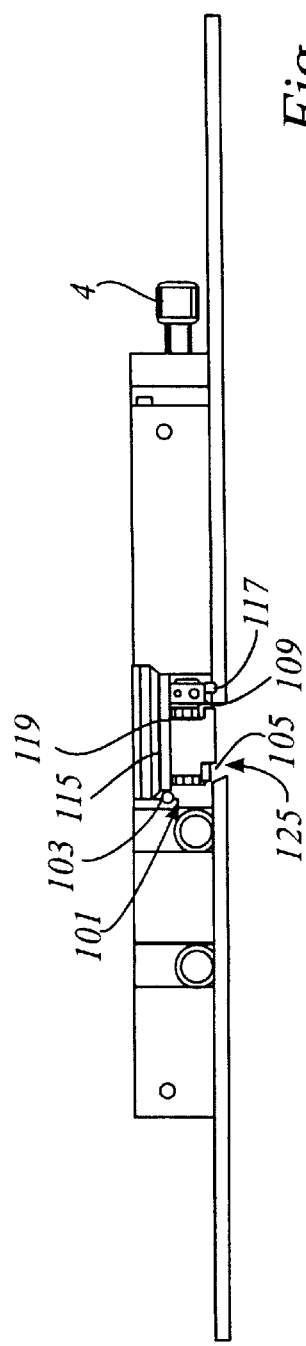

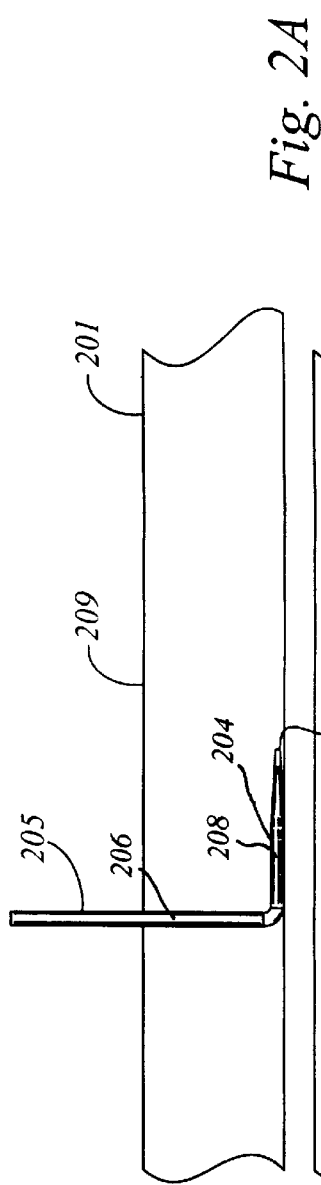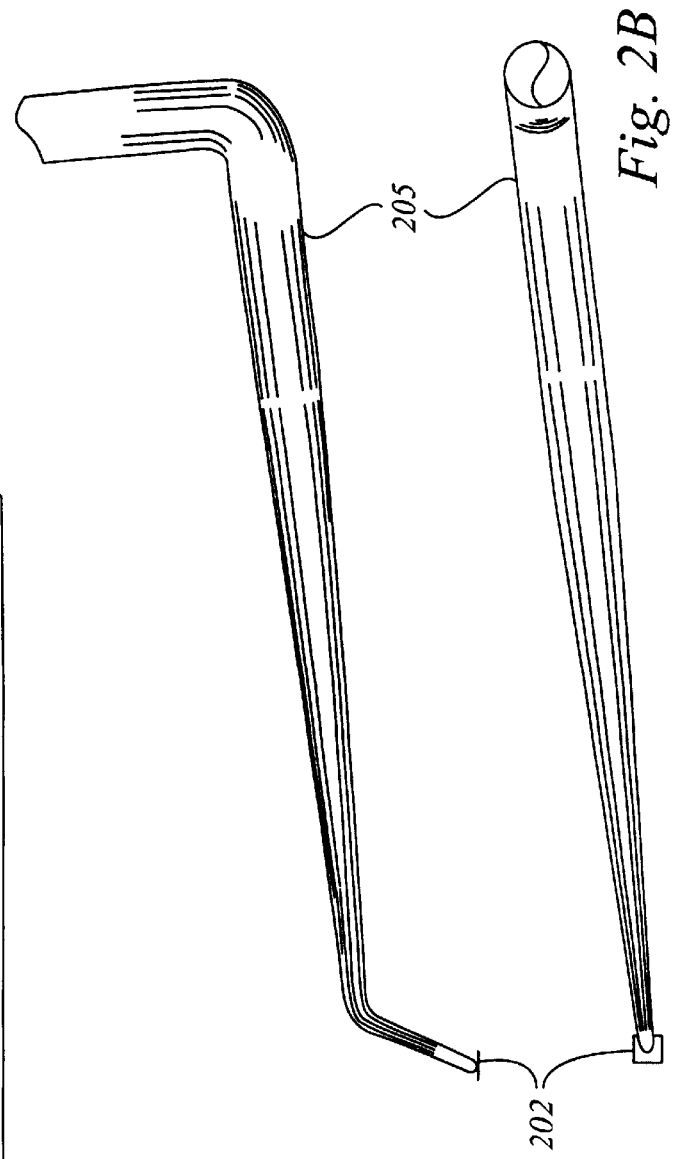

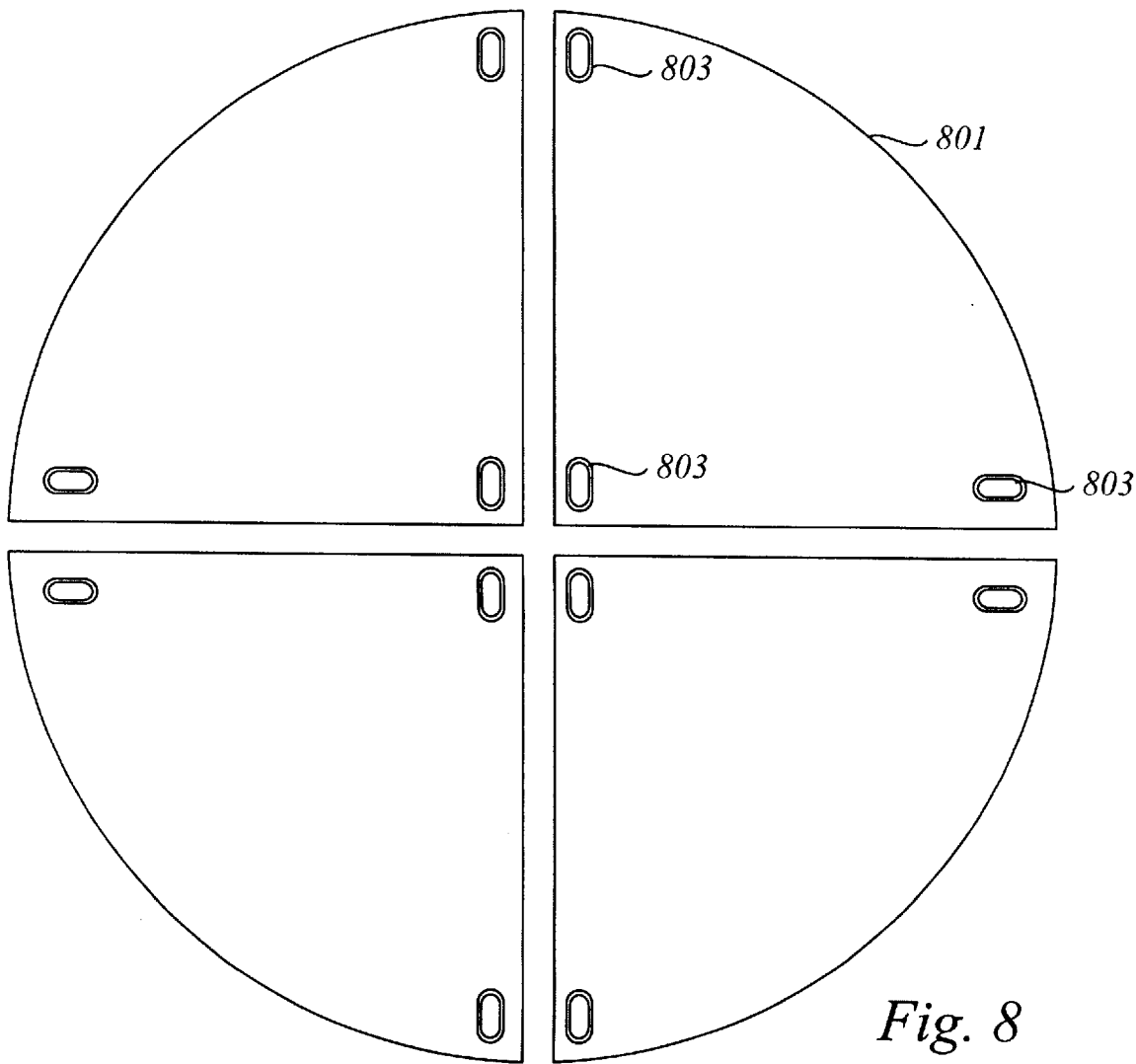
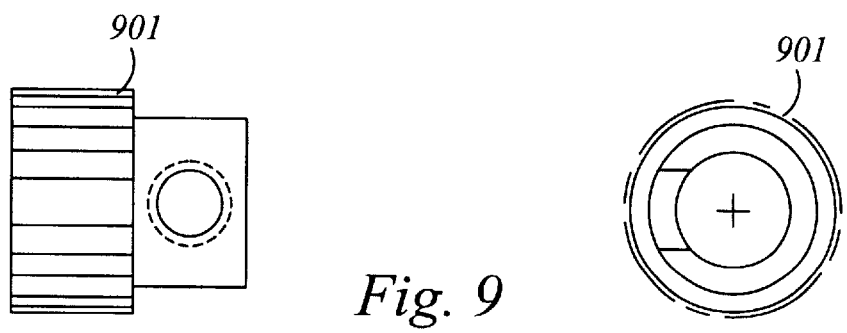
Fig. 8
Fig. 9

TOP VIEW

BOTTOM VIEW

TOP VIEW

SIDE VIEW

BOTTOM VIEW
WAFER NOT SHOWN

PROBE TILE FOR PROBING SEMICONDUCTOR WAFER

This application is a continuation-in-part of application Ser. No. 09/021,631, filed Feb. 10, 1998 now issued U.S. Pat. No. 6 201,402.

FIELD OF THE INVENTION

This invention relates generally to semiconductor test equipment, and more particularly, to a system and method for using a plurality of probe tiles and probes for electrically probing a semiconductor wafer.

BACKGROUND OF THE INVENTION

The semiconductor industry has a need to access many electronic devices on a semiconductor wafer. As the semiconductor industry grows and devices become more complex, engineers and scientists require tools to access devices quickly and easily on a semiconductor wafer. Many wafer tests take hours, days, or weeks to perform, and would more efficiently be performed in parallel. Probe cards have been developed to probe long rows or areas of the wafer. However, these developments are still geared to a short-term electrical tests and a limited temperature range.

Semiconductor wafer probing is typically performed with probe cards built using FR-4, polyamide or a similar material. Such cards typically use an epoxy ring to hold tungsten probes in place. These types of probe cards are generally designed for probing one device at a time on the wafer in a narrow temperature range. The larger vendors of these types of probe cards are Cerprobe, Probe Technology, MJC Japan, and others. Probers, built by companies such as Electraglass and TEL, step the probe card across the wafer so the devices on the wafer can be electrically probed.

Ceramic versions of a typical probe card have been developed, however these are limited to, and designed for, probing a single device. Other ceramic probe cards have been designed for probing a confined area of a wafer at a narrow temperature range. These probe cards can be permanently damaged and broken if driven into the wafer.

No method is currently known to probe multiple locations over a broad area on a semiconductor wafer. The need to access several locations on a semiconductor wafer will increase as design rules shrink device features, the speed of devices increases, and device shipments continue to grow at high rates. Therefore, there is a need for a way to probe multiple locations on a semiconductor wafer. Further, there is a need for a robust probe card which may probe a wafer at a wide temperature range without breaking.

SUMMARY OF THE INVENTION

In one embodiment of the present invention, a tile used to hold one or more probes for testing a semiconductor wafer is disclosed. The tile has one or more sites for inserting one or more probes to test the semiconductor wafer. Each site has one or more holes. Each hole is coupled with a slot forming an angle. A probe is inserted into the tile from a top of the tile through the hole and seated on the slot. The probe has a probe tip. The probe tip is in contact with the semiconductor wafer at one end of the slot at a bottom of the tile. The probe tip is aligned with X and Y coordinates of a bond pad on the semiconductor wafer.

BRIEF DESCRIPTION OF THE DRAWINGS

The present invention is illustrated by way of example by the accompanying drawings, in which like references indicate similar elements and in which:

FIGS. 1A, 1B, 1C, 1D show a top, front, and side view, and bottom view of a probe tile and probe platform compatible with the present invention;

FIG. 2A shows a ceramic tile, probe wire, and semiconductor wafer detail compatible with the present invention;

FIG. 2B shows an exemplary probe and bond pad compatible with the present invention;

FIG. 8 shows pie shaped ceramic tiles compatible with the present invention;

FIG. 9 shows a gear wheel compatible with the present invention.

DETAILED DESCRIPTION

In the following description of a preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

For purposes of explanation, numerous specific details are set forth in the following description in order to provide a thorough understanding of the present invention. However, it will be evident to one of ordinary skill in the art that the present invention may be practiced without some of these specific details. In other instances, well-known structures and devices are shown in block diagram form in order to facilitate description.

The present invention significantly decreases the amount of time required to probe multiple dies on a semiconductor wafer. The present invention is useful in assisting the determination of semiconductor reliability, and assisting device manufacturers with device development, research and development, process development, yield enhancement, device failure analysis and device testing.

Figure 1A:
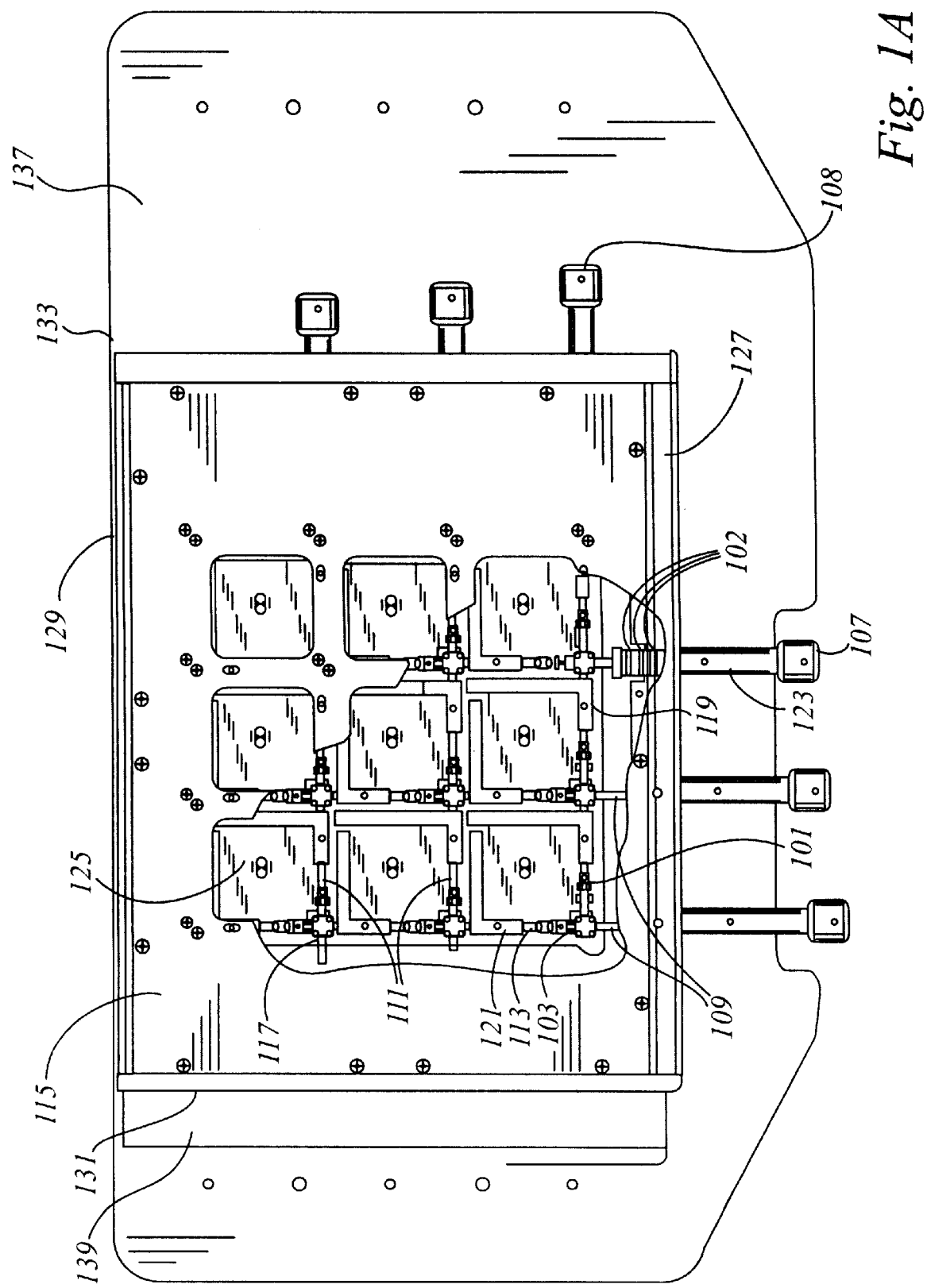

The present invention provides a probe tile and probe platform for electrically probing many semiconductor wafer bond pads over a broad area of the semiconductor wafer. Nine ceramic tiles are configured in a flat three by three matrix, and are held in place by a probing platform. The tiles preferably have the dimensions of 1.8 inches (45.7 mm) long, by 1.8 inches (45.7 mm) wide, by 0.125 inches (3.2 mm) high, but it will be recognized by one of ordinary skill in the art that other tile dimensions, for example four inch tiles or six inch tiles, may be used without loss of generality. Each tile may be moved independently in an X and Y direction. FIG. 1A illustrated one embodiment of the probe platform having three side control knobs 108 to move a tile in the X direction and three front controls knobs 107 to move a tile in the Y direction. The front control knobs 107 are attached to front transmission shafts 109, and the side control knobs 108 are attached to side transmission shafts 111. The front and side transmission shafts 109 and 111 slide back and forth into three ball detent positions 102. The ball detent positions 102 determine which tile is engaged and can be manipulated. The front and side control knobs 107 and 108 and ball detent positions 102 are preferably operated by hand, but may also be attached to a motor or other movement mechanism for automatic positioning and selecting of the semiconductor wafers and dies during testing. It will be recognized by one of ordinary skill in the art that the number of ceramic tiles, control knobs, and transmission shafts may be increased or decreased without loss of generality. For example, the present invention could be configured with sixteen tiles having four control knobs and transmission shafts on the side of the platform and four control knobs and transmission shafts on the front of the platform.

A preferred embodiment of the present invention is shown in FIGS. 1A, 1B, and 1C. A round front control knob 107 is connected to a front transmission shaft 109, and a round side control knob 108 is connected to a side transmission shaft 111. The front control knob 107 or the side control knob 108 permits the user to transmit rotational power to a transmission shaft. There are three side control knobs 108 and three side transmission shafts 111 on the right side of the probing platform, and there are three front control knobs 107 and three front transmission shafts 109 on the front of the probing platform.

A front transmission shaft 109 or a side transmission shaft 111 is connected to three gears 101. The front transmission shaft 109 or the side transmission shaft 111 transmits rotational power to the connected gears 101. Each round front control knob 107 and front transmission shaft 109 or each round side control knob 108 and side transmission shaft 111 is connected to a round detent strike 123. The detent strike 123, together with a ball plunger 135, permits the user to engage only one gear at a time by sliding it back and forth in three detent positions 102. A gear 101 is connected to a front transmission shaft 109 or a side transmission shaft 111. The gear 101 transmits rotational input from the front transmission shaft 109 or the side transmission shaft 111 to a stub shaft gear 103.

The stub shaft gear 103 is connected to a stub shaft 113. The stub shaft gear 103 transmits rotational input from the gears to the stub shaft 113. As the stub shaft 113 rotates, threads move the X-transfer block 119 back and forth in the X direction, or the Y-transfer block 121 back and forth in the Y direction.

The stub shaft 113 and the front transmission shaft 109 or the side transmission shaft 111 are held in place by a square bearing 117. There are preferably sixteen square bearings 117, one located at each corner of the three by three matrix.

Figure 1D:
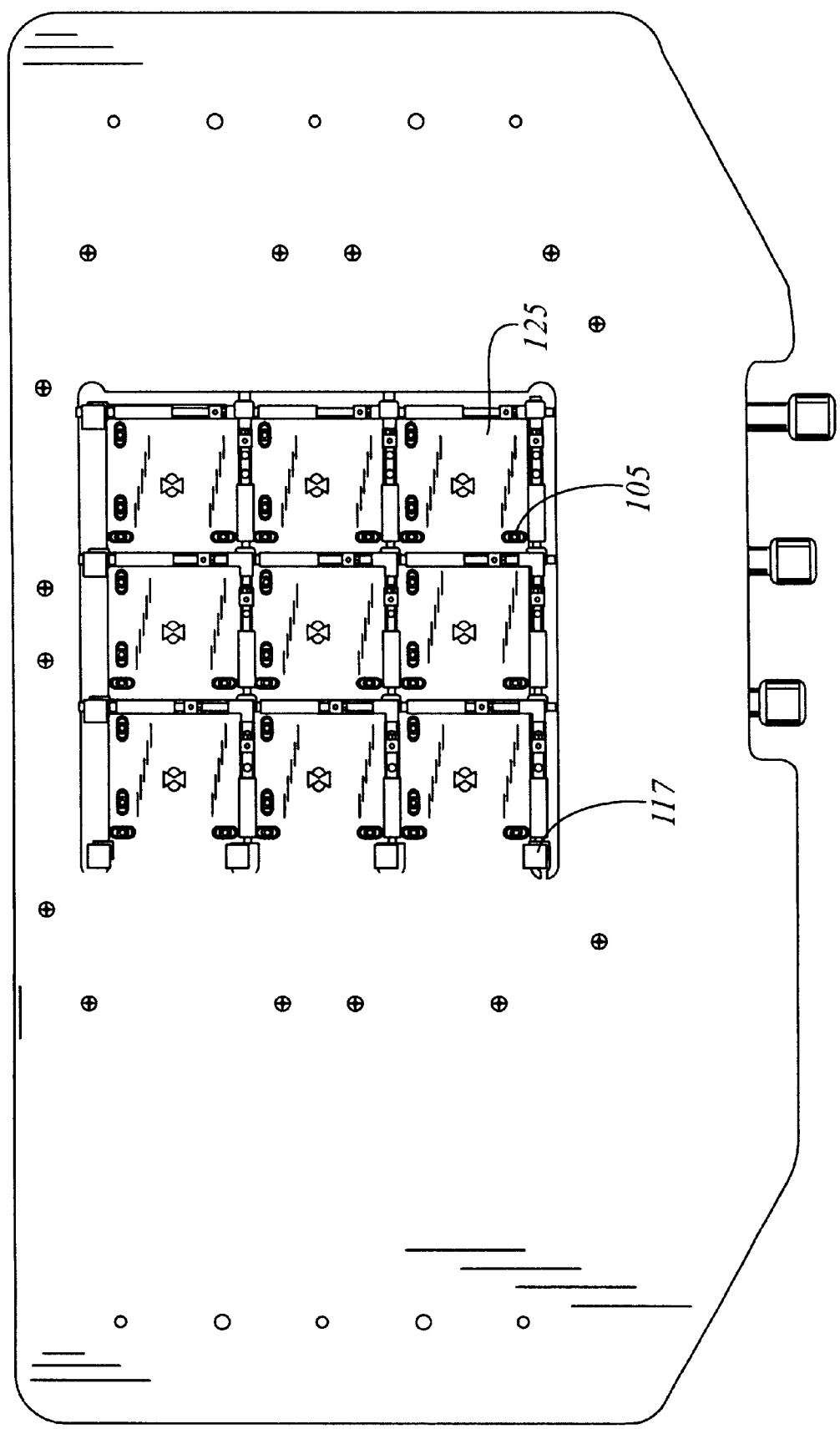

A ceramic tile 125 is fastened to the X-transfer block 119 and the Y-transfer block 121 by a round tile bushing 105, and a flat head screw. There are preferably three bushings 105 and three screws used on each tile 125. FIG. 1D illustrates an exemplary bottom view of the platform, showing the square bearings 117, the bushing 105, and the tile 125. The square bearings 117 are preferably held in place by a mounting plate 115. The mounting plate 115 is held in place by front standoff 127, back standoff 129, left standoff 131, and right standoff 133. The standoffs attach to a base plate 137.

A removable clear glass plate 139 is present on the platform. Not shown is a removable opaque cover, roughly conforming to the shape of the mounting plate 115, that may be placed over the glass plate 139 during light sensitive experiments. Also not shown are vacuum couplings, attached to base plate 137, which provide a vacuum to retain the base plate 137 to a probe station.

The base plate 137, as well as certain other portions of the platform, are preferably constructed from stainless steel throughout to permit testing in high temperatures and to provide a thermal coefficient of expansion equal in all parts of the platform.

Figure 3:
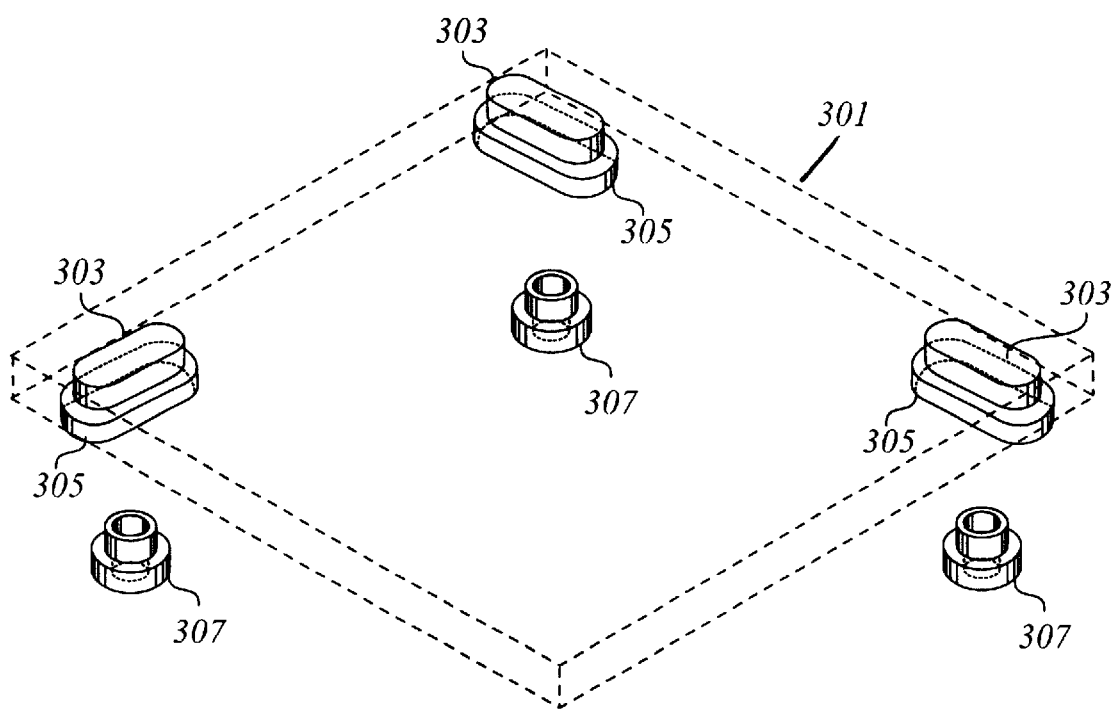
FIG. 3 shows an exploded view of a ceramic tile with tile bushings compatible with the present invention.

As shown in FIG. 2A, a ceramic tile 201 holds electrochemically etched tungsten prone tips 203 to permit semiconductor wafer testing over a wide temperature range. The probes 205 are self-aligning and preferably have a high density of 0.020 inch linear pitch. As shown in FIG. 2A, the probes configured to fit the tile pattern of the probe platform. The tungsten probes 205 (with a beam or cantilever 204 and the probe tip 203) are preferably set into drilled longitudinal holes 206 and transverse slots 208 (each longitudinal hole 206 being coupled with the transverse slot 208) in each ceramic tile with high temperature ceramic epoxy, but it will be recognized by one of ordinary skill in the art that the probes may be attached in other ways and by other means without loss of generality. It will also be recognized that while the probes 205 may be made of tungsten, they may also be made of electrically conductive material, such as beryllium copper (BeCu), which does not substantially deform and remains electrically conductive over a wide range of temperatures. FIG. 2B illustrates an exemplary drawing of the probe 205 and the bond pad 202. As shown in FIG. 3, a ceramic tile 301 includes special mounting holes 303 and guides 305 to allow their connections to the trobe platform. Bushings 307 are used to attach the tile to the probe platform.

Figure 4A:
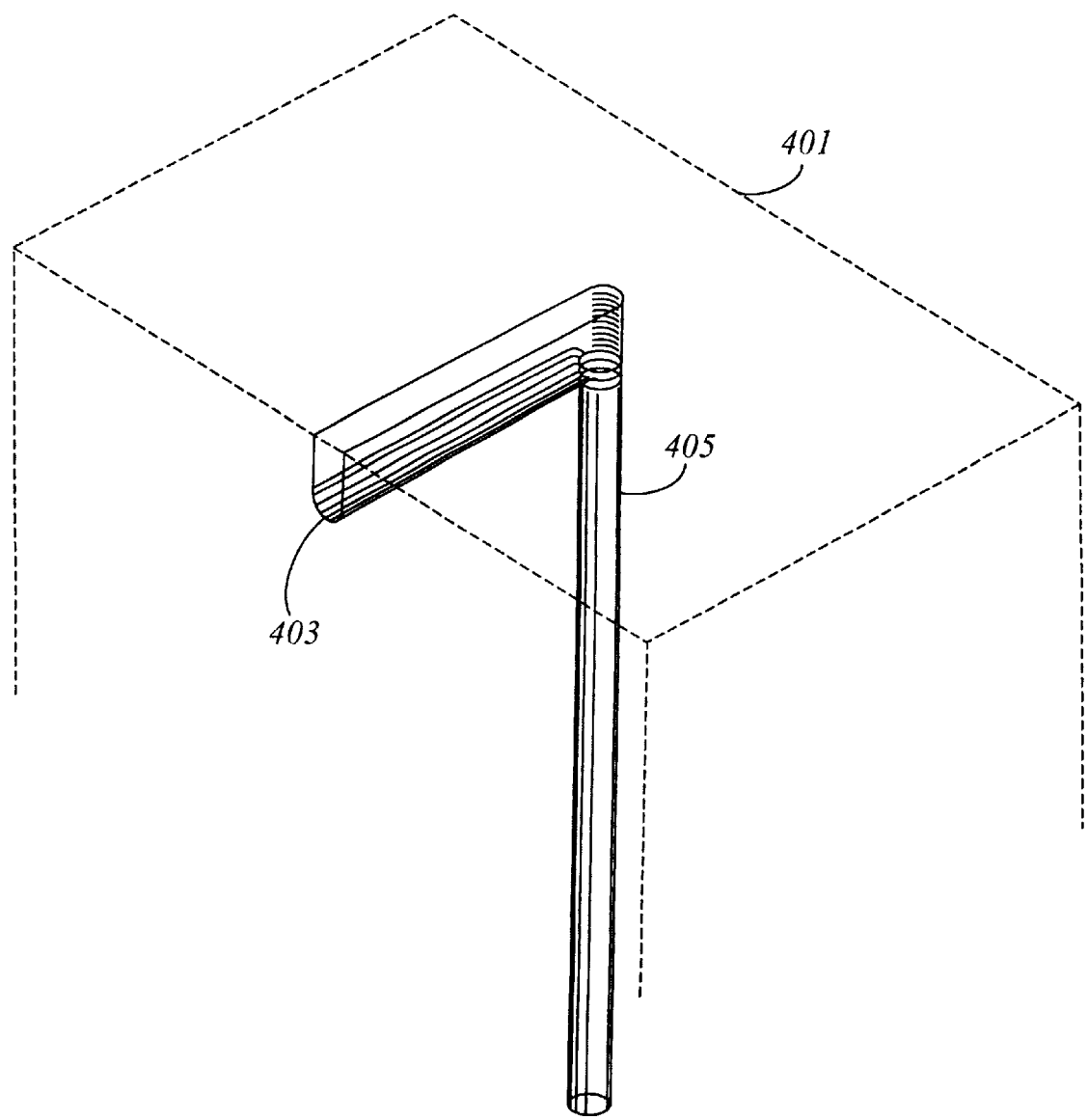
FIG. 4A shows a milled self-aligning hole compatible with the present invention.
Figure 4B:
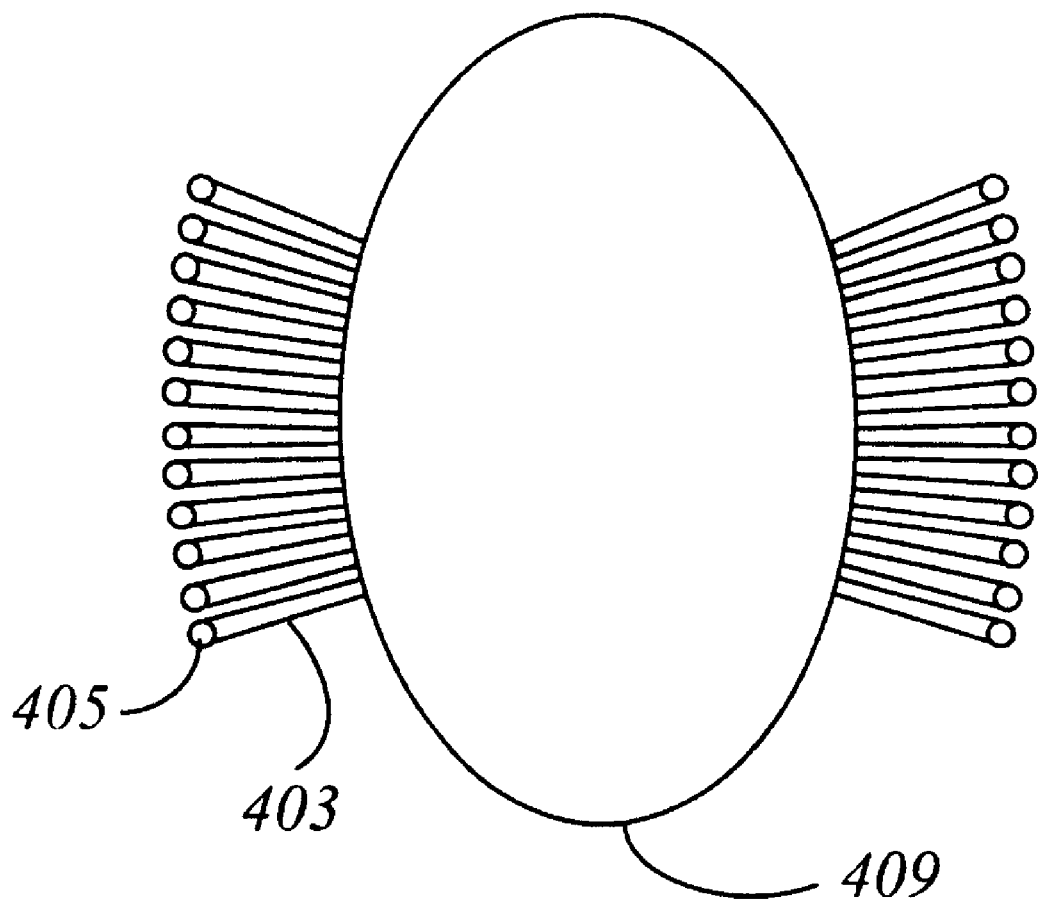
FIG. 4B illustrates an exemplary drawing of a plurality of drill holes, machined guides, and view hole compatible with the present invention.
Figure 4C:
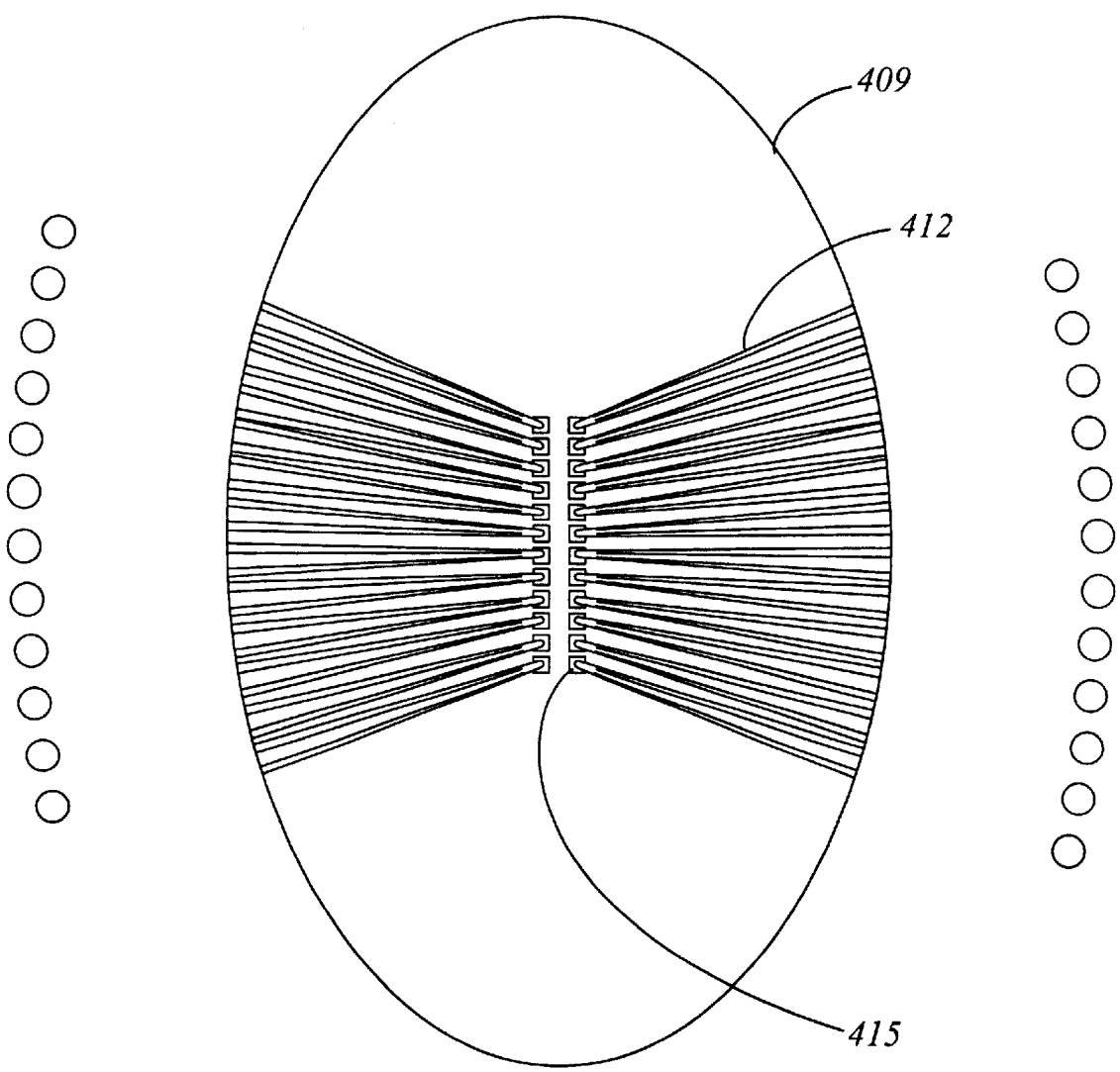
FIG. 4C illustrates an exemplary close up top down view of the view hole showing the plurality of probes.

As shown in FIG. 4A, the tungsten probes are typically placed in precision machined guides 403 and drill holes 405 in the ceramic tile 401 to self align the probes with bond pads on the semiconductor wafer. FIG. 4B illustrates an exemplary drawing of a plurality of drill holes 405, machined guides 403, and view hole 409. The number of probes on a semiconductor wafer is primarily dependent upon the semiconductor wafer type and the number of electrical contacts. There may be as little as one probe, or else there may be many probes per semiconductor wafer. Drilled holes 405 and machined guides 403 in the ceramic tiles 401 are provided to accommodate the tungsten probes. FIG. 4C illustrates an exemplary close up top down view of the view hole showing the plurality of probes. Through the view hole 409, the plurality of probes 412 and the bond pads 415 can be seen.

Referring back to FIG. 2A, the semiconductor wafer 207 rests on a semiconductor wafer chuck below the ceramic tile 201 which enables the tungsten probes 205 to then make electrical contact with the bond pad of the semiconductor wafer 207.

View holes 209 may optionally be created through some or all of the ceramic tiles to permit viewing of the semiconductor wafer 207 if required by certain applications. The low profile of the ceramic tiles 201 enables a dry nitrogen environment near the semiconductor wafer 207, and the optionally present view holes 209 enable the ability to view a device under test (DUT) without breaking the nitrogen environment. To maintain a dry nitrogen environment, a clear glass plate is placed in the platform, forming a seal with the platform. The seal may be a loose seal if a positive pressure nitrogen environment is maintained. Alternatively, the seal may be gas-tight if a non-positive pressure nitrogen environment is used.

Figure 5:
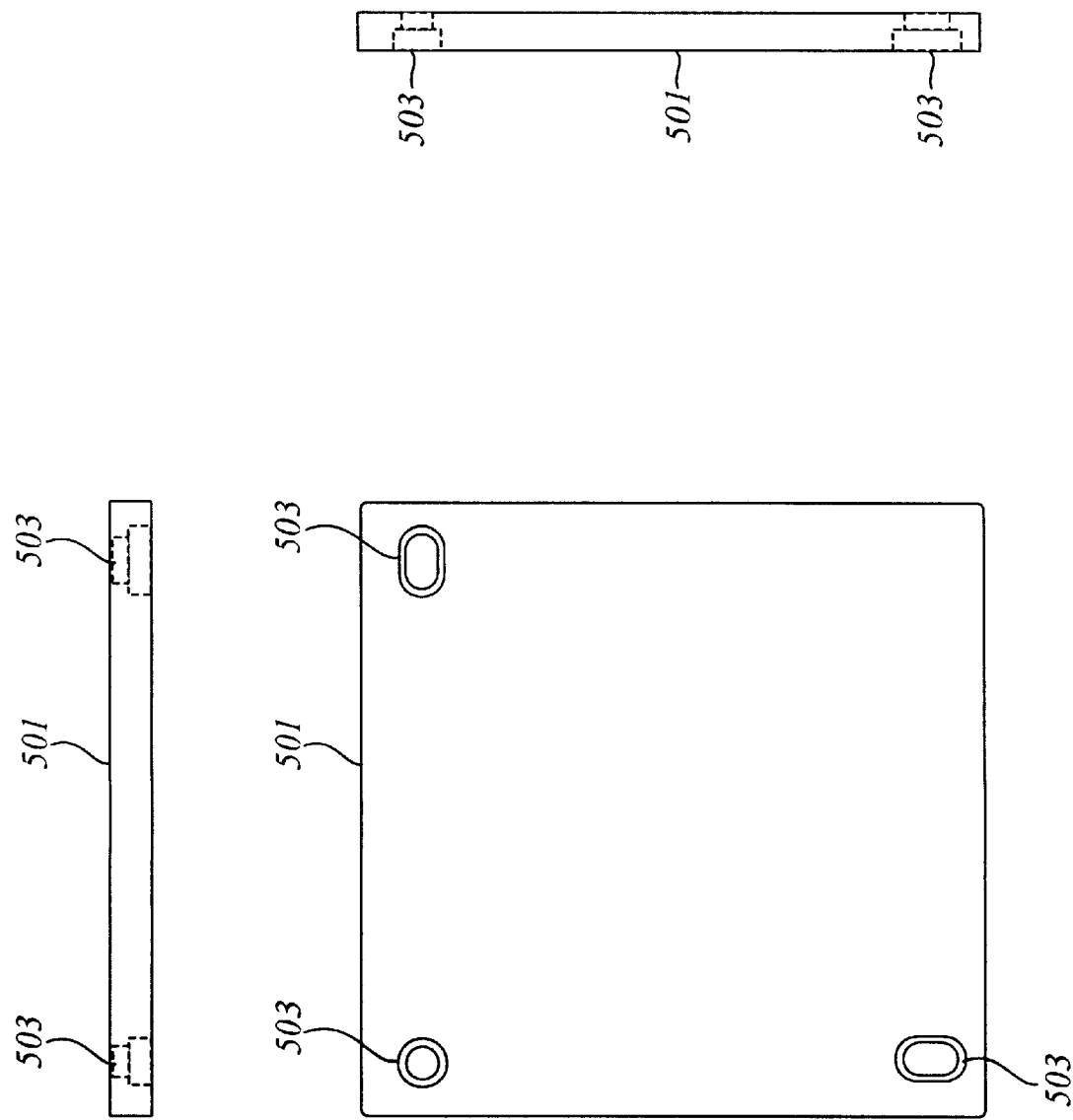
FIG. 5 shows a small square ceramic tile compatible with the present invention.
Figure 6:
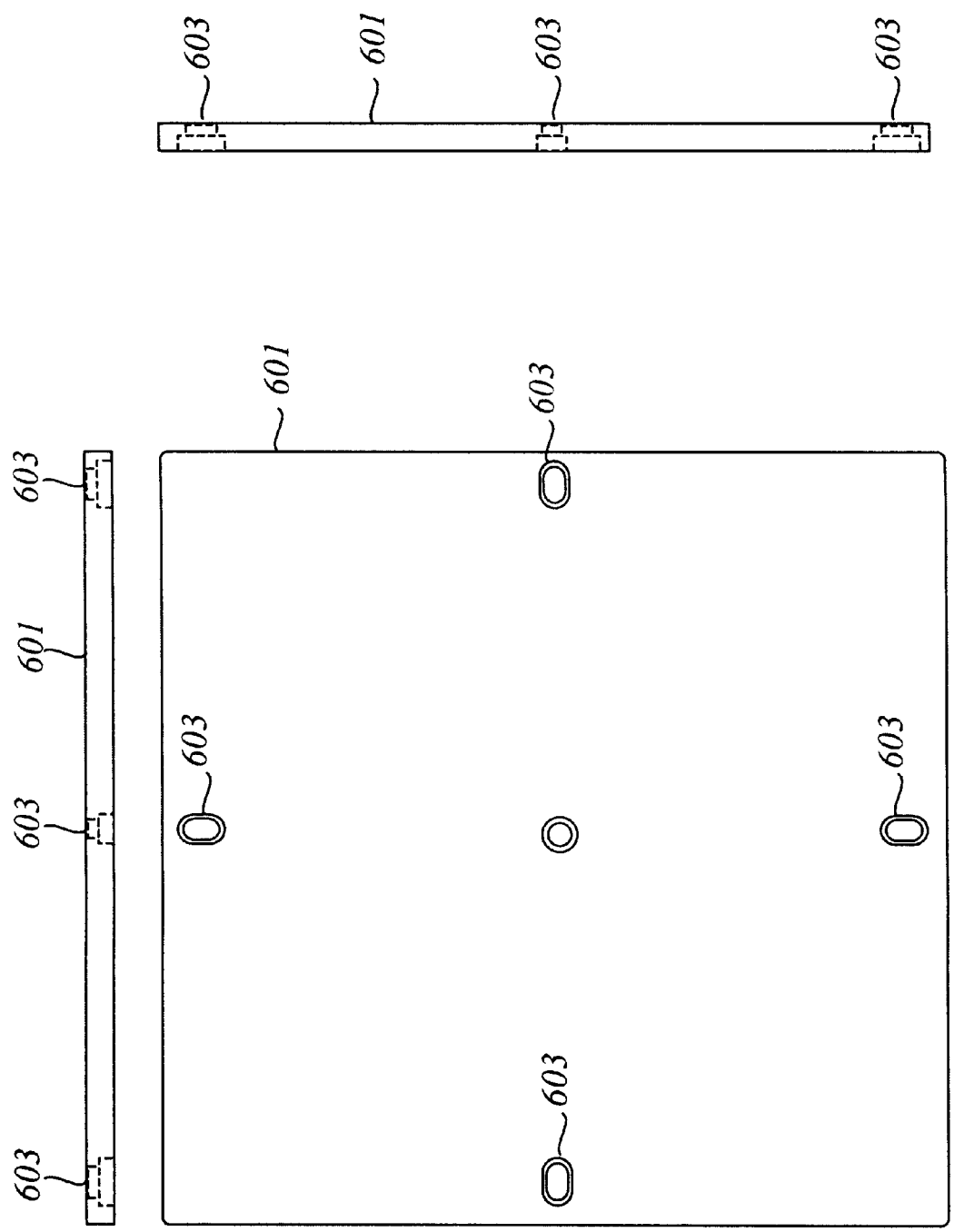
FIG. 6 shows a square ceramic tile compatible with the present invention.
Figure 7:
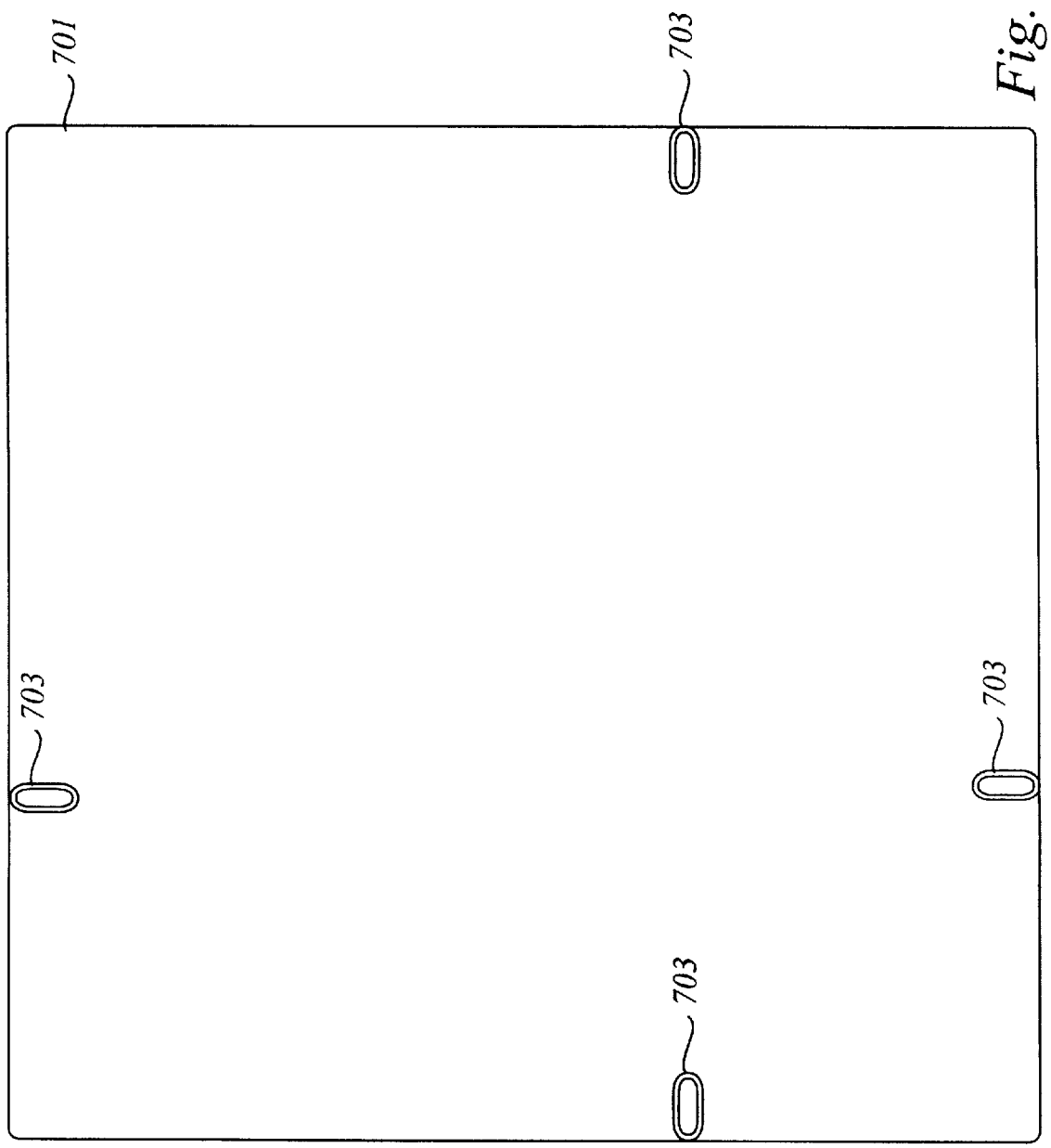
FIG. 7 shows a large square ceramic tile compatible with the present invention.

Alternative embodiments of ceramic tiles which may be used with the present invention are shown in FIGS. 5, 6, 7, and 8. As shown in FIG. 5, a preferred embodiment of the tile may be a 62 mm×62 mm square tile 501 having three retainer slots 503, one each of the retainer slots 503 being located in three of the four corners of the tile. As shown in FIG. 6, an alternative embodiment of the tile may be a 110 mm×110 mm square tile 601 having four retainer slots 603, one each of the retainer slots 603 being located along each edge of the tile and substantially centered along each side. As shown in FIG. 7, an alternative embodiment of the tile may be a 160 mm×160 mm square tile 701 having four retainer slots 703, one each of the retainer slots 703 being located along each edge of the tile and substantially off-centered along each side. As shown in FIG. 8, another alternative embodiment of the tile may be pie shaped tiles 801 with a combined radius of 200 mm square, each tile having three retainer slots 803, one each of the retainer slots 803 being located in each of the three corners of a tile 801. It will be recognized by one of ordinary skill in the art that the dimensions of a tile, and the number and placement of retainer slots on a tile, may vary from the embodiments described above without loss of generality.

A preferred gear wheel 901 is shown in FIG. 9, showing a side view and a front view. A gear wheel 901 is attached to the front transmission shafts 109 and to the side transmission shafts 111, as shown by gears 101 in FIG. 1. The gear wheels engage each other and transmit rotational power from a front transmission shaft 109 or a side transmission shaft 111 to move a probe tile in the direction of either the X direction or Y direction.

The tile and probe platform discussed above together form the probe card to electrically probe many semiconductor wafer bond pads over a broad area of a semiconductor wafer. The platform positions the tile over the semiconductor wafer. The tile can be replaced without replacing the platform Furthermore, tiles of different sizes can be used with the platform to accommodate change in devices and wafer requirements. This is advantageous over the existing probe card technology (e.g., epoxy ring probe cards, ceramic blade probe cards, etc.). For example, the probes on the epoxy ring probe card are epoxyed in place on a substrate, and the ceramic blades on the ceramic probe cards are soldered in place. The tiles in the present invention are constructed of a rigid ceramic to provide thermal, mechanical and electrical characteristics to allow the tiles to perform in high temperature over a long period of time. The tiles and the stainless steel probe platform allow the probe card to operate in a wide temperature range (e.g., −65 degress Celcius to 300 degrees Celcius) or at low current leakages at one site or at multiple sites. This is advantageous over the existing probe card technology, which normally operates in a narrower temperature range.

In one embodiment, the tile described above may be mounted on a printed circuit board (PCB) to test the wafer. In this case, the tile is held in place by the PCB instead of by the platform. The tile can be in different sizes and thickness. For example, when mounted on the PCB, the tile can be round, square, rectangular or hexagonal, from 30 m.m. in diameter to 210 m.m. in diameter. The thickness varies (e.g., 3 m.m. to 9 m.m.) depending on the stiffness required. One or more probes are mounted on the tile. The probes are used to electrically probe multiple devices or multiple sites depending on the layout of the semiconductor wafer to be probed.

The probes are placed into the tile according to the bond pad pattern. As discussed above, the tile is designed with slots (or grooves) and drilled holes to accommodate the probes. The slot and drilled holes are fabricated into the tile in a manner that allows the seated probe to be aligned with the X and Y coordinates of the bond pad on the semiconductor wafer. The slot forces a specific X, Y and Z orientation of the probe. In one embodiment, the slot and the drilled hole form a 90 degrees angle (e.g., "L" shape) to help the probe self align with the bond pad. Each probe is inserted into the drilled hole and seats itself into the slot.

Figure 10:
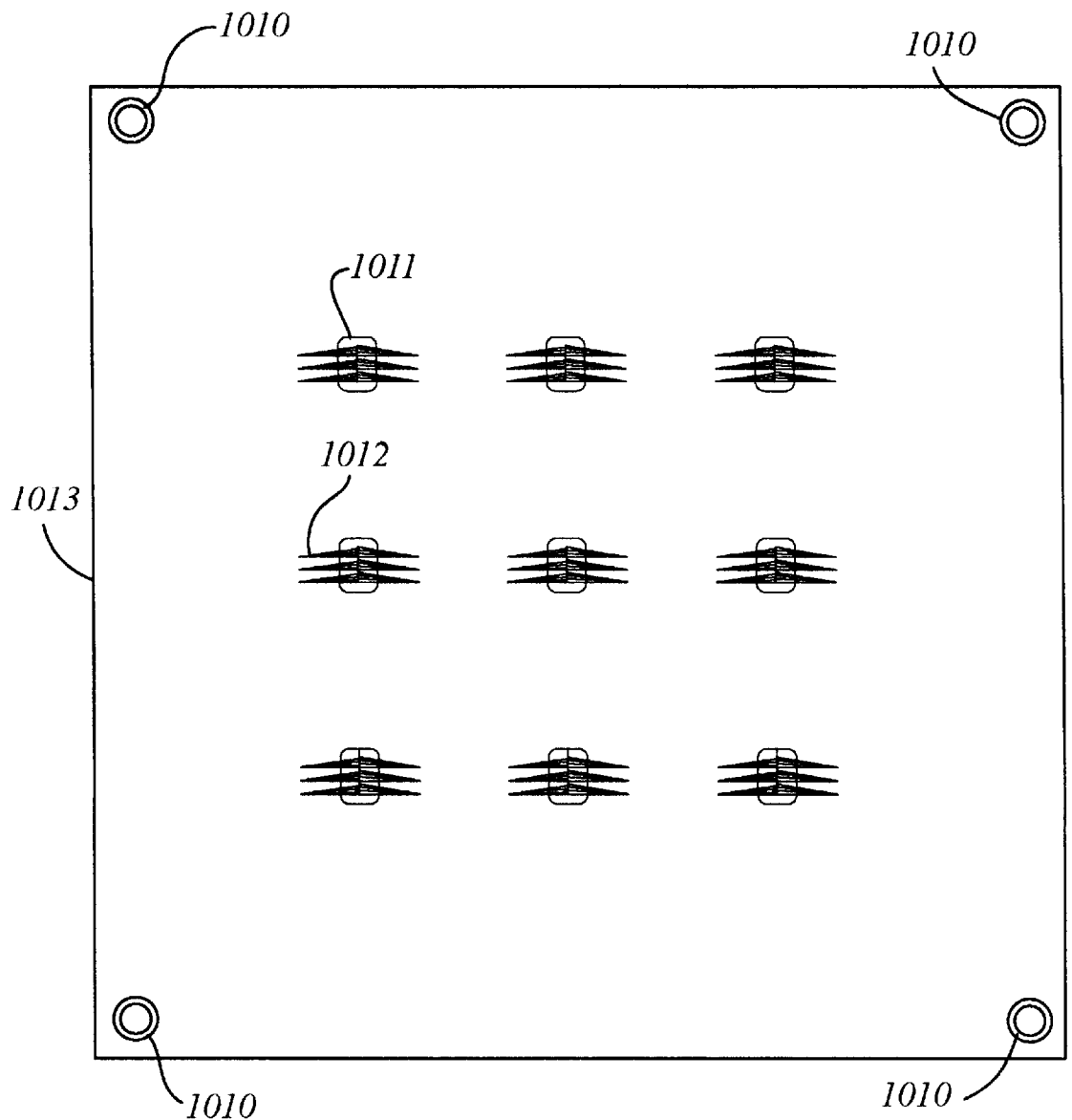
FIG 10A is an exemplary illustration of a bottom-up view of a tile with multiple probes.
FIG. 10B is an exemplary illustration of a top-down view of the tile illustrated in FIG. 10A.
Figure 10:
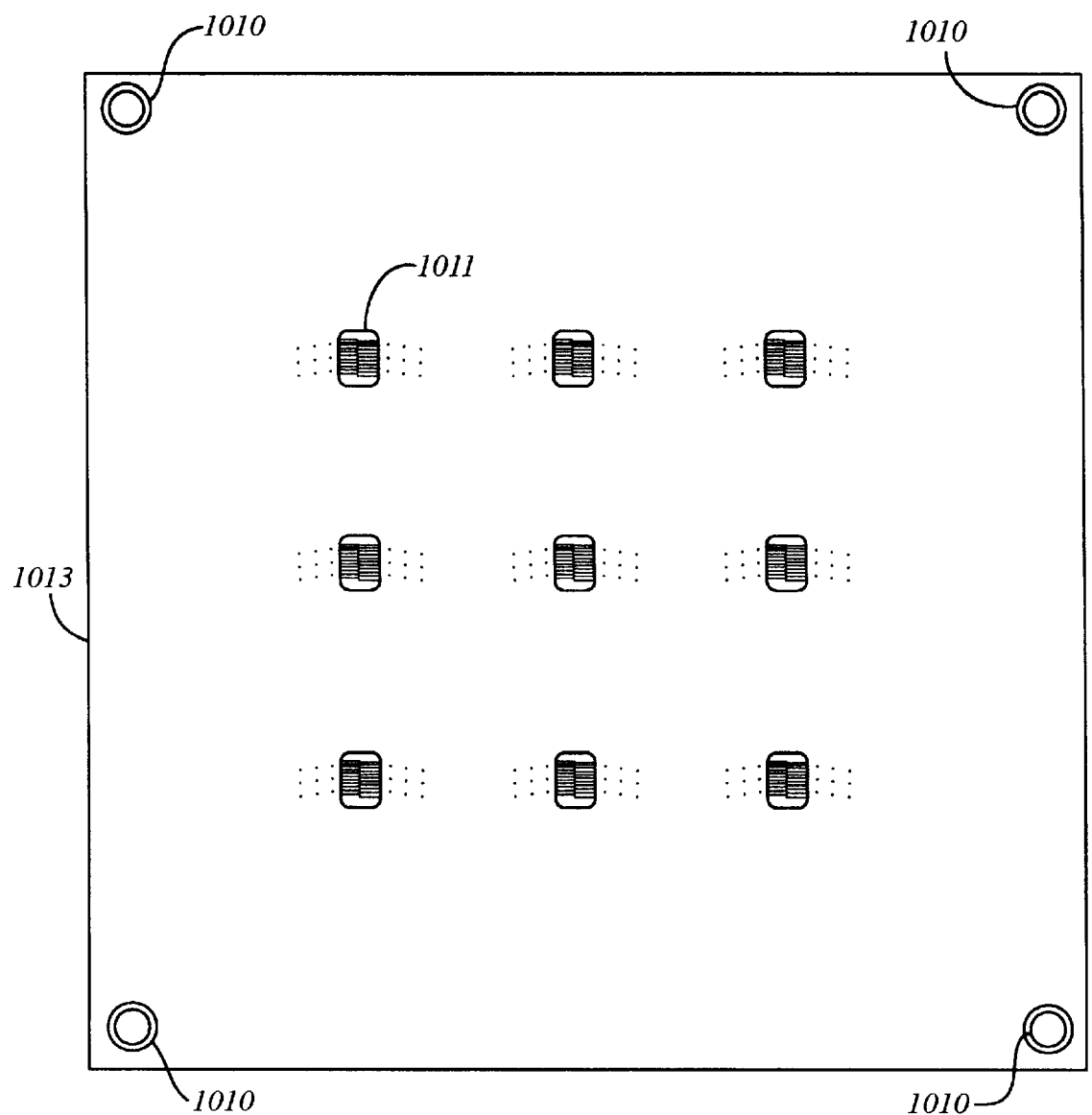

FIG. 10A is an exemplary illustration of a bottom-up view of a tile with multiple probes. In this example, the probes are mounted in nine sites across the tile 1013. Also illustrated in FIG. 10A are the retainer slots 1010, the probes 1012 at each of the nine locations and the view hole 1011. Each of the probes 1012 can be removed from its slot and drilled hole without disturbing adjacent probes. The number of sites on the tile, the number of probes accommodated by the tile, the positions of the probes, and the size of the tile vary depending on the area of coverage and the number of sites to be probed.

The probes may be connected to wires to interface with a test system. The probes may also be connected to the PCB using a permanent solder connection or a spring contact pin receptacle. The spring contact permits quick replacement of any damaged probes. FIG. 10B is an exemplary illustration of a top-down view of the tile illustrated in FIG. 10A. The tile is shown without the PCB or the wire interface.

Figure 11:
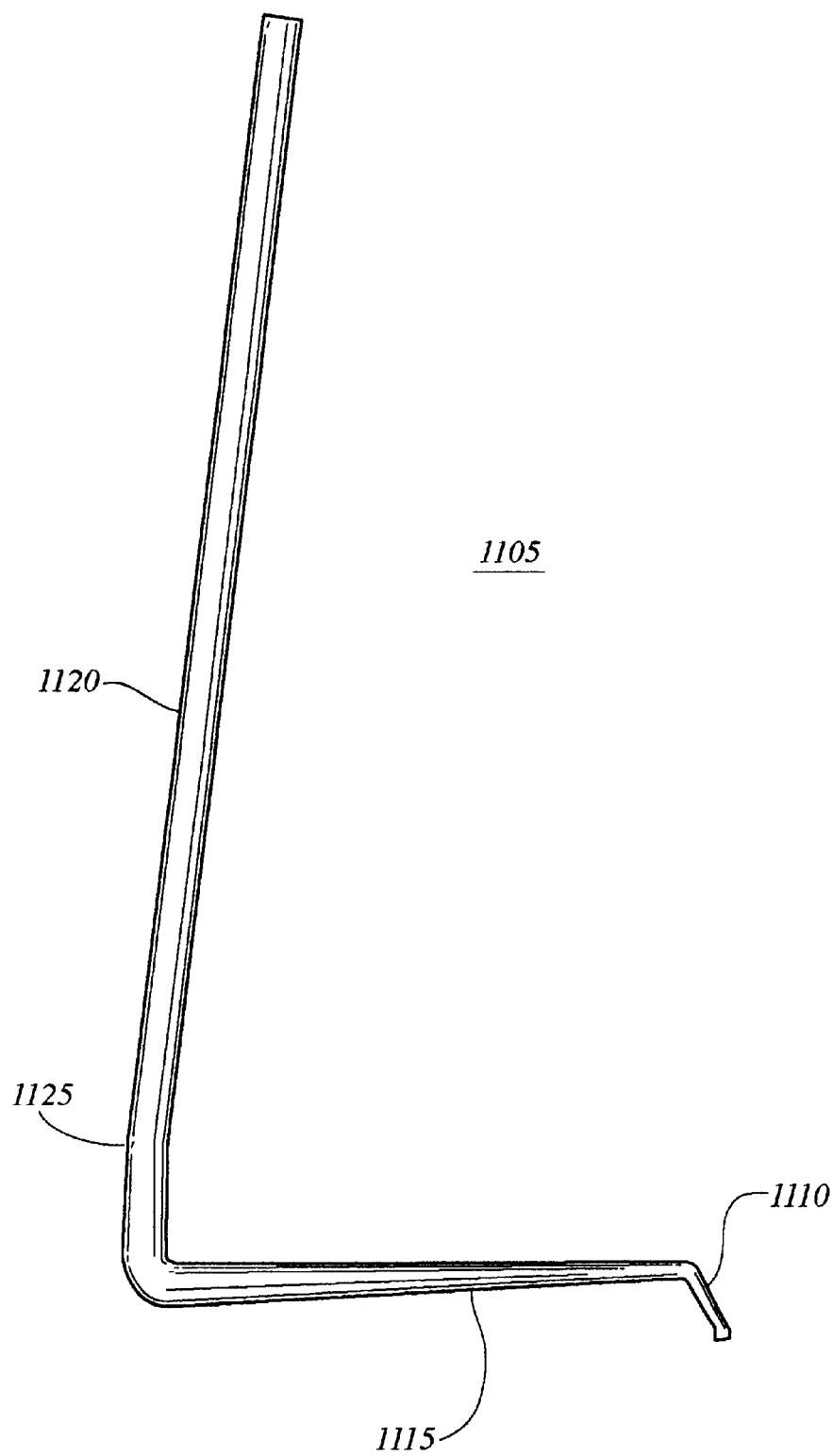
FIG. 11 is an exemplary illustration of one embodiment of a probe in the present invention.

FIG. 11 is an exemplary illustration of one embodiment of a probe in the present invention. The probe 1105 is FIG. 11 comprises a probe tip 1110, a beam or cantilever 1115, and the vertical shank 1120 that goes through the tile. The probe tip 1110 is the bent down end of the probe 1105 that touches the bond pad. When the probe tip 1110 is damaged or worn out the entire probe 1105 is replaced. The probe 1105 is different from the probe 205 in FIG. 2A and FIG. 2B. The vertical shank of the probe 205 in FIG. 2A and FIG. 2B is straight, whereas the vertical shank 1120 of the probe 1105 in FIG. 11 has a kink at location 1125. The kink is advantageous because it provides a spring action to the probe 1105 to firmly retain the probe 1105 in the drilled hole (for example 206) and slot (for example 208) of the tile (for example 201 as shown in FIG. 2A).

Figure 12A:
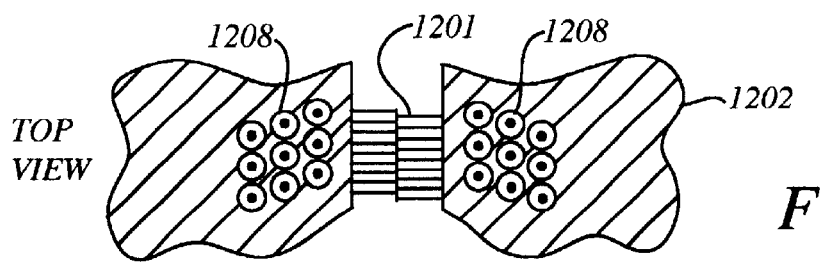
FIGS. 12A, 12B and 12C illustrate one exemplary embodiment of a tile mounted on a PCB configuration used in a high temperature environment.
Figure 12B:
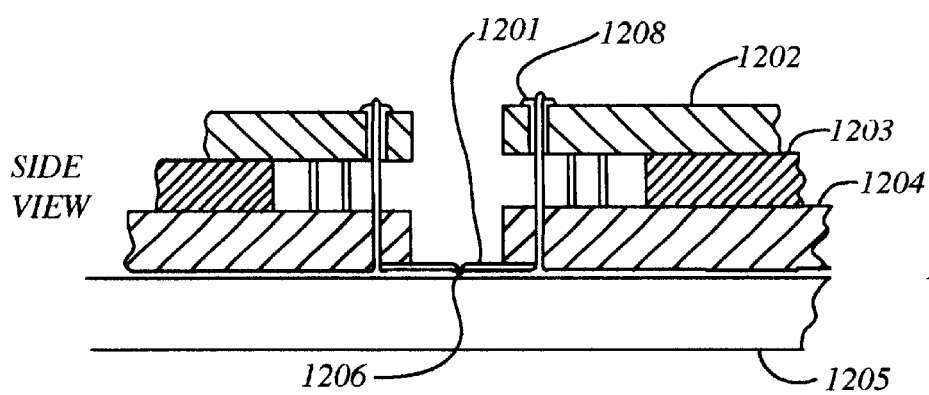
Figure 12C:
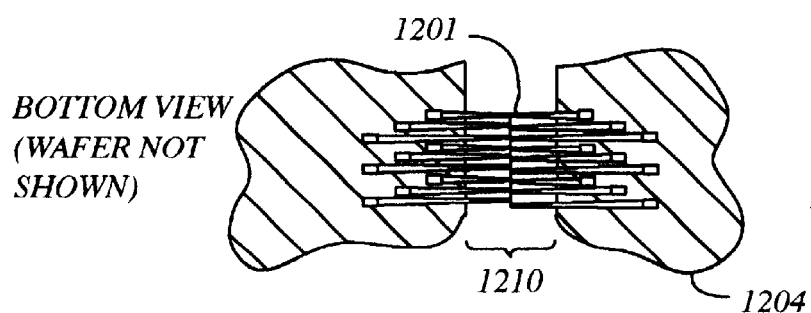

FIGS. 12A, 12B and 12C illustrate one exemplary embodiment of a tile mounted on a PCB configuration used in a high temperature environment. FIG. 12A illustrates a top view, FIG. 12B illustrates a side view, and FIG. 12C illustrates a bottom view. The tile 1204 is mounted onto the PCB 1202. A stand off and thermal insulating material 1203 separates the tile 1204 from the PCB 1202. The insulating material 1203 allows the tile 1204 to be used at high temperatures without causing deterioration of the PCB 1202 that has a lower operating temperature. The probe 1201 is attached to the PCB 1202 using a spring contact pin receptacle 1208. The probe tip of the probe 1201 is in contact with the semiconductor wafer bond pad 1206 to probe the semiconductor wafer 1205. The space 1210 represents the opening in the view hole.

Figure 13A:
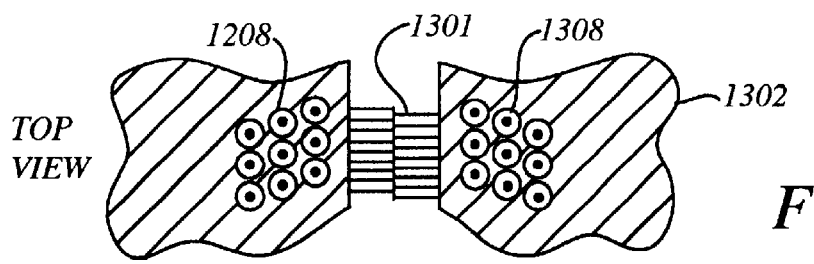
FIGS. 13A, 13B and 13C illustrate one exemplary embodiment of a tile configuration used in an environment where high temperature is not required.
Figure 13B:
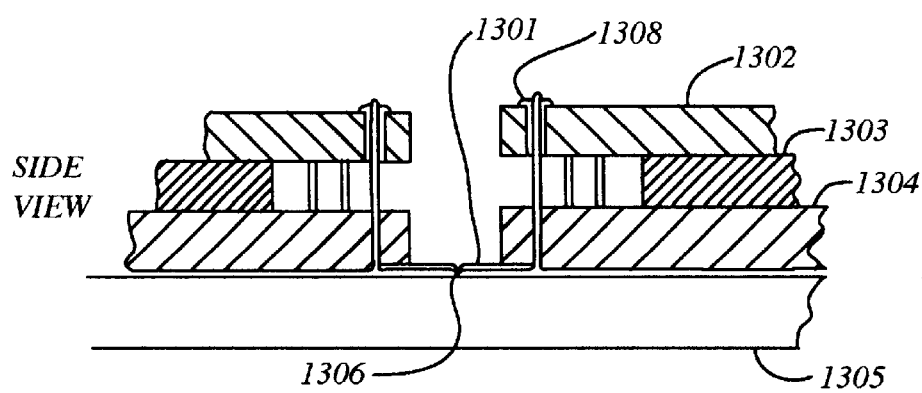
Figure 13C:
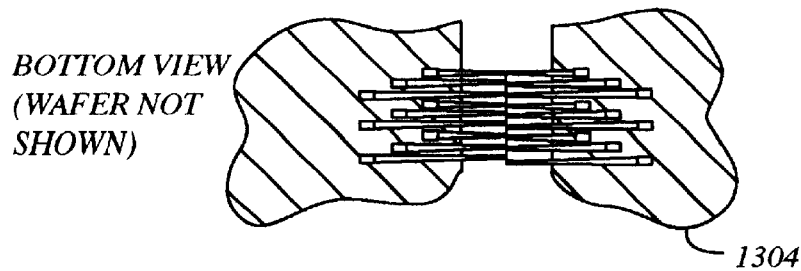

FIGS. 13A, 13B and 13C illustrate one exemplary embodiment of a tile configuration used in an environment where high temperature is not required. FIG. 13A illustrates a top view, FIG. 13B illustrates a side view, and FIG. 13C illustrates a bottom view. The tile 1304 is mounted onto the PCB 1302. There is no stand off thermal insulating material between the tile 1304 and the PCB 1302 because this embodiment is not used in high temperature environments. The probe 1301 is attached to the PCB 1302 using a spring contact pin receptacle 1308. The probe tip of the probe 1301 is in contact with the semiconductor wafer bond pad 1306 to probe the semiconductor wafer 1305.

Figure 14A:
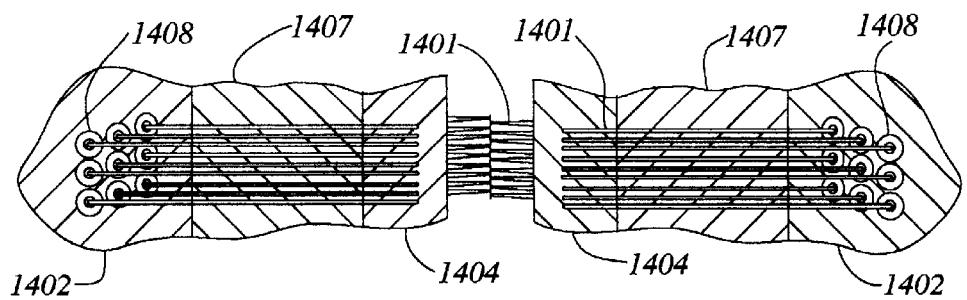
FIGS. 14A, 14B and 14C illustrate one exemplary embodiment of a tile configuration used in an environment where high temperature is not required.
Figure 14B:
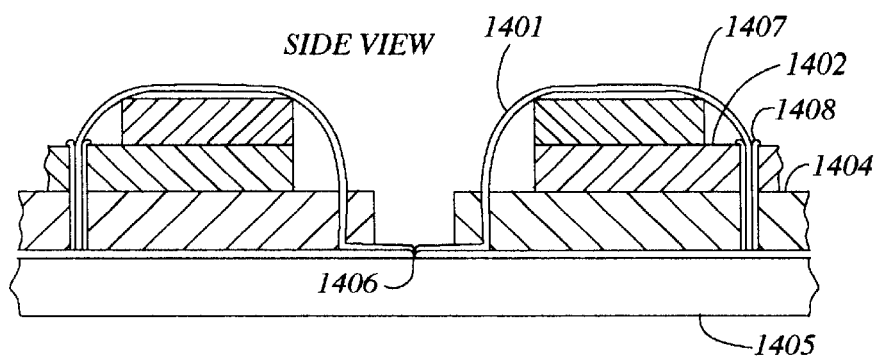
Figure 14C:
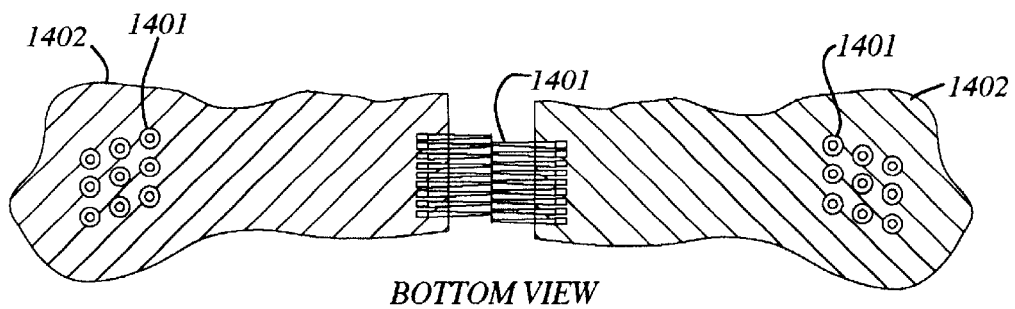

FIGS. 14A, 14B and 14C illustrate one exemplary embodiment of a tile configuration used in an environment where high temperature is not required. FIG. 14A illustrates a top view, FIG. 14B illustrates a side view, and FIG. 14C illustrates a bottom view. The tile 1404 is mounted onto the PCB 1402. In this embodiment a wire guide is used to provide various probe patterns by swapping the tiles on one PCB. There is no stand off thermal insulating material between the tile 1504 and the PCB 1502 because this embodiment is not used in high temperature environments. The probe 1401 is attached to the PCB 1402 using a spring contact pin receptacle 1408. The probe tip of the probe 1401 is in contact with the semiconductor wafer bond pad 1406 to probe the semiconductor wafer 1405. The wire guide 1407 is made of an insulating material.

Figure 15A:
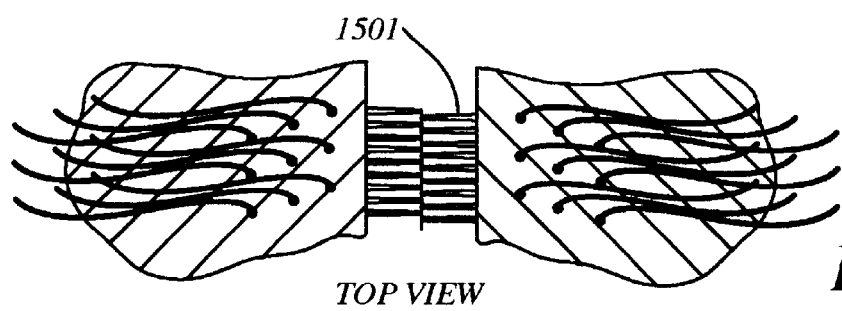
FIGS. 15A, 15B and 15C illustrate one exemplary embodiment of a tile configuration used in an environment where high temperature is not required.
Figure 15B:
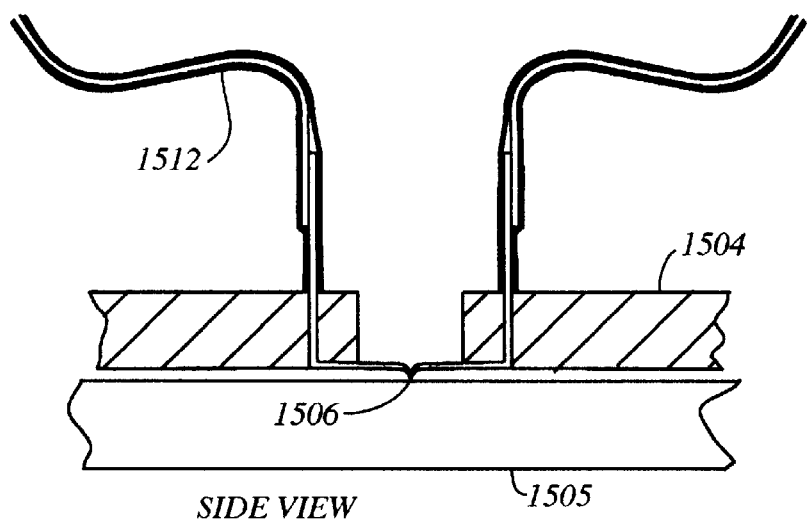
Figure 15C:
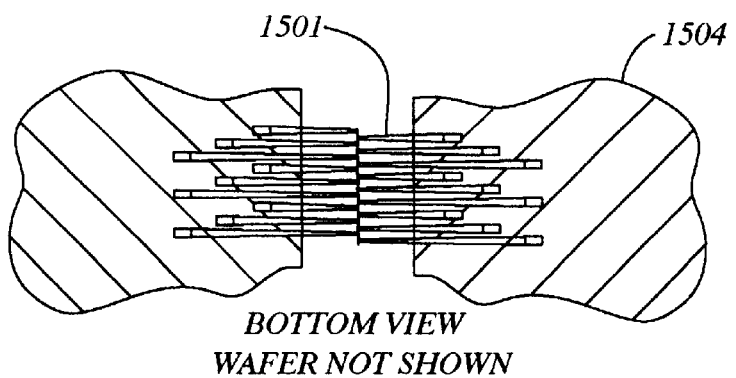

FIGS. 15A, 15B and 15C illustrate one exemplary embodiment of a tile configuration used in an environment where high temperature is not required. FIG. 15A illustrates a top view, FIG. 15B illustrates a side view, and FIG. 15C illustrates a bottom view. In this embodiment, each probe 1501 is attached to an insulated wire 1512. There is no spring contact pin receptacle when quick removal and replacement of the probe 1501 is not required. Furthermore, there is no stand off thermal insulating material used with the tile 1504 because this embodiment is not used in high temperature environments. The probe 1501 is attached to the tile 1504 semi permanently with epoxy. The probe tip of the probe 1501 is in contact with the semiconductor wafer bond pad 1506 to probe the semiconductor wafer 1505.

Thus what has been described is a tile and a probe used for electrically conductive probing of semiconductor wafer. The tile is specifically designed with slots and drilled holes to accommodate a probe. The probe can be inserted into any drilled holes in the tile. Each probe may be designed with a kink to help keep the probe seated in the tile. When quick removal is necessary, the probe can be held in place by using spring contact pin receptacle. The probe is fabricated in an angle including a kink to act as a spring to retain the probe in the drilled hole of the tile. Typically, the probe described above is made of tungsten. However, the probe can also be fabricated using other conductive alloy or similar materials. In addition, although the invention describes probing the semiconductor wafer, one skilled in the art would recognize that the invention may also be used to test a multi-chip module and other substrates.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. In a semiconductor wafer testing system where at least one probe used to test a semiconductor wafer, a tile is used to hold the at least one probe for making contact with the semiconductor wafer, the tile comprising:

at least one site for inserting the at least one probe to test the semiconductor wafer, each site having at least one hole, each hole coupled with a slot forming an angle, wherein the probe is inserted into the tile through the hole and seated on the slot, the probe having a probe tip in contact with the semiconductor wafer at one end of the slot at a bottom of the tile, wherein the probe tip is aligned with X and Y coordinates of a bond pad on the semiconductor wafer; and wherein the probe has a kink to spring the probe against a wall of the hole in the tile to hold the probe in place.

2. The tile of claim 1, wherein the angle formed by the hole and the slot is 90 degrees.

3. The tile of claim 1 further comprising a view hole at each site to view the probe tip.

4. The tile of claim 1, wherein each of the probes is removable from the tile without affecting remaining probes.

5. The tile of claim 4, wherein each of the probes is attached to the tile with epoxy.

6. The tile of claim 1, wherein the hole and the slot form a L-shape with the angle therebetween.

7. The tile of claim 1, wherein each of the probes is attached to an insulated wire.

8. In a semiconductor wafer testing system where one or more probes are used to test a semiconductor wafer and where a tile, having a longitudinal hole coupled with a transverse slot forming an angle, is used to hold the one or more probes for making contact with the semiconductor wafer, the probe comprising:

a probe tip;

a cantilever coupled with the probe tip; and a vertical shank coupled with the cantelever, the vertical shank forming the angle with the cantilever to align the probe tip with X and Y coordinates of a bond pad on the semiconductor wafer, wherein the vertical shank and the cantilever of the probe are inserted into the tile through the longitudinal hole and the transverse slot, and wherein the vertical shank has a kink to retain the probe in the tile.

9. The probe of claim 8, wherein the angle is 90 degrees.

10. The probe of claim 8, wherein the kink in the vertical shank springs against a wall of the longitudinal hole in the tile to hold the probe in place.

11. In a test system where at least one probe used to test a substrate, a method, comprising:

mounting a tile on a printed circuit board (PCB), wherein:
the tile comprises at least one site for inserting at least one probe to test the semiconductor wafer, each site having at least one hole, each hole coupled with a slot forming an angle, and
the probe comprises a probe tip, a vertical shank a cantilever coupled with the probe tip, wherein the probe is inserted into the tile through the hole and seated on the slot, the vertical shank forming the angle with the cantilever, the angle aligning the probe tip with X and Y coordinates of a bond pad on the semiconductor wafer, and wherein the vertical shank has a kink to spring against a wall of the hole in the tile to hold the probe in place; and attaching the probe to the PCB using a spring contact, wherein the probe is removed from the tile by releasing the spring contact.

12. The method of claim 11, further comprising separating the tile and the PCB by a thermal insulating layer when the semiconductor wafer is tested in a high temperature.

13. The method of claim 11, further comprising removing a damaged probe from the tile without affecting non-damaged probes inserted in the tile.

14. The method of claim 11, further comprising providing a view hole on the tile to view the probe tip.

15. The method of claim 11, wherein the angle formed is 90 degrees.

16. The method of claim 11, wherein the hole and the slot form a L-shape with the angle therebetween.

* * * * *

UNITED STATES PATENT AND TRADEMARK OFFICE
CERTIFICATE OF CORRECTION

PATENT NO. : 6,586,954 B2
DATED : July 1, 2003
INVENTOR(S) : Bryan J. Root

It is certified that error appears in the above-identified patent and that said Letters Patent is hereby corrected as shown below:

<u>Column 4,</u>
Line 49, reads "connections to the trobe" should read -- connections to the probe --

Signed and Sealed this

Second Day of March, 2004

JON W. DUDAS
*Acting Director of the United States Patent and Trademark Office*